United States Patent [19]
Aakalu et al.

[11] Patent Number: 6,008,475
[45] Date of Patent: Dec. 28, 1999

[54] HEAT PROVIDING STRUCTURE FOR AN ELECTRICAL ASSEMBLY

[75] Inventors: Nandakumar G. Aakalu, Suffern, N.Y.; Peter Giannoglou, Montclair; Woodly Maurice, Irvington, both of N.J.

[73] Assignee: Lucent Technologies Inc., Murray Hill, N.J.

[21] Appl. No.: 09/158,593

[22] Filed: Sep. 22, 1998

[51] Int. Cl.[6] .................................................. H05B 1/00
[52] U.S. Cl. ........................... 219/209; 219/385; 219/393
[58] Field of Search .................................. 219/209, 385, 219/393, 399, 402, 407

[56] References Cited

U.S. PATENT DOCUMENTS

| | | | |
|---|---|---|---|
| 2,762,895 | 9/1956 | Throw | 219/19 |
| 3,601,661 | 8/1971 | Kleinhample | 317/100 |
| 4,186,369 | 1/1980 | Attridge et al. | 338/274 |
| 4,454,566 | 6/1984 | Coyne | 361/386 |
| 4,860,163 | 8/1989 | Sarath | 361/384 |
| 5,309,981 | 5/1994 | Binder | 265/64 |

*Primary Examiner*—Teresa Walberg
*Assistant Examiner*—Shawntina Fuqua

[57] ABSTRACT

An enclosure for electronic components which is provided with a heater mounted to an exterior wall to maintain a minimum operating temperature for the electronic components without utilizing space within the enclosure.

7 Claims, 3 Drawing Sheets

HEAT PROVIDING STRUCTURE FOR AN ELECTRICAL ASSEMBLY

BACKGROUND OF THE INVENTION

This invention relates to an electrical assembly which must operate within a defined temperature range and, more particularly, to structure for providing heat for such an assembly.

An electrical assembly utilized as a base station for a cellular telephone system is typically mounted outdoors, where it is exposed to the environment. Such an assembly includes heat generating components and is mounted within an enclosure, and therefore some means for dissipating the heat generated by the components must be provided. It is known to provide a heat sink including heat conducting fins on the exterior of the enclosure for dissipating heat generated within the enclosure. These fins are typically planar and parallel to define vertical channels between adjacent pairs of the fins. However, when the outdoor temperature is very low, particularly when the electronic components have not been turned on for an extended period of time, the components are below the minimum temperature at which they function properly. It is also known to provide a heater within the enclosure to maintain a proper operating environment for the internal electronic components, even when the outdoor temperature is very low. However, such a heater takes up valuable space within the enclosure, which could otherwise be used for electronic components. It would therefore be desirable to provide structure for heating an electrical assembly when required, which structure does not interfere with the allocation of space for electronic components.

SUMMARY OF THE INVENTION

In accordance with the principles of this invention, an enclosure for electronic components includes structure for providing heat for the components. The structure comprises a heat conductive outer wall for the enclosure and a heating element mounted to the exterior of the outer wall.

In accordance with an aspect of this invention, the outer wall includes an external boss having a cavity and the heating element is secured in the cavity in heat conducting contact therewith.

In accordance with another aspect of this invention, the outer wall is formed with a plurality of external parallel heat conducting fins and the external boss is formed between a pair of adjacent ones of the fins.

BRIEF DESCRIPTION OF THE DRAWINGS

The foregoing will be more readily apparent upon reading the following description in conjunction with the drawings in which like elements in different figures thereof are identified by the same reference numeral and wherein.

DETAILED DESCRIPTION

Figure 1:
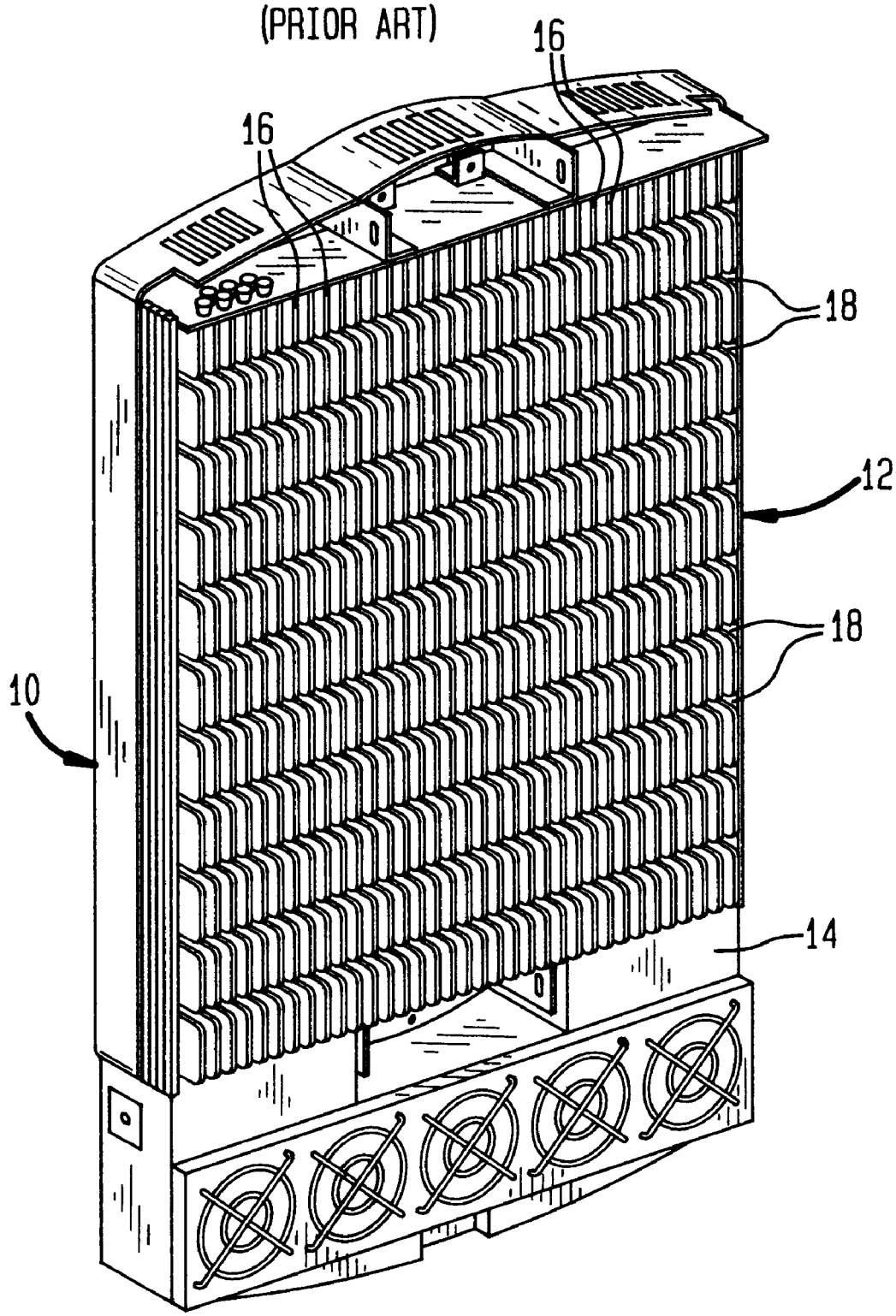
FIG. 1 is a perspective view showing an exemplary prior art electrical assembly enclosure having heat conducting fins.

Referring now to the drawings, FIG. 1 shows an electrical assembly enclosure 10 with heat conducting fins 12 on an exterior wall 14 of the enclosure 10. While FIG. 1 only illustrates fins 12 on one exterior wall 14 of the enclosure 10, the enclosure 10 is generally in the shape of a parallelepiped and an array of fins will typically also be provided on the exterior wall opposed to the exterior wall 14. The fins 12 comprise an array of heat conducting parallel planar fins which are aligned parallel to a vertical axis when the enclosure 10 is mounted as intended. An exemplary material for forming the fins 12 and the exterior wall 14 as a unitary construction is cast aluminum. Thus, between adjacent pairs of the fins 12 a plurality of vertical channels 16 are defined. The distal edge of each of the fins 12 remote from the exterior wall 14 is preferably a substantially straight line, and all such edges (lines) lie in a single plane. However, each of the fins is formed with a plurality of notches in its distal edge. These notches are aligned with the notches of all the other fins to define a plurality of horizontal channels 18.

Figure 2:
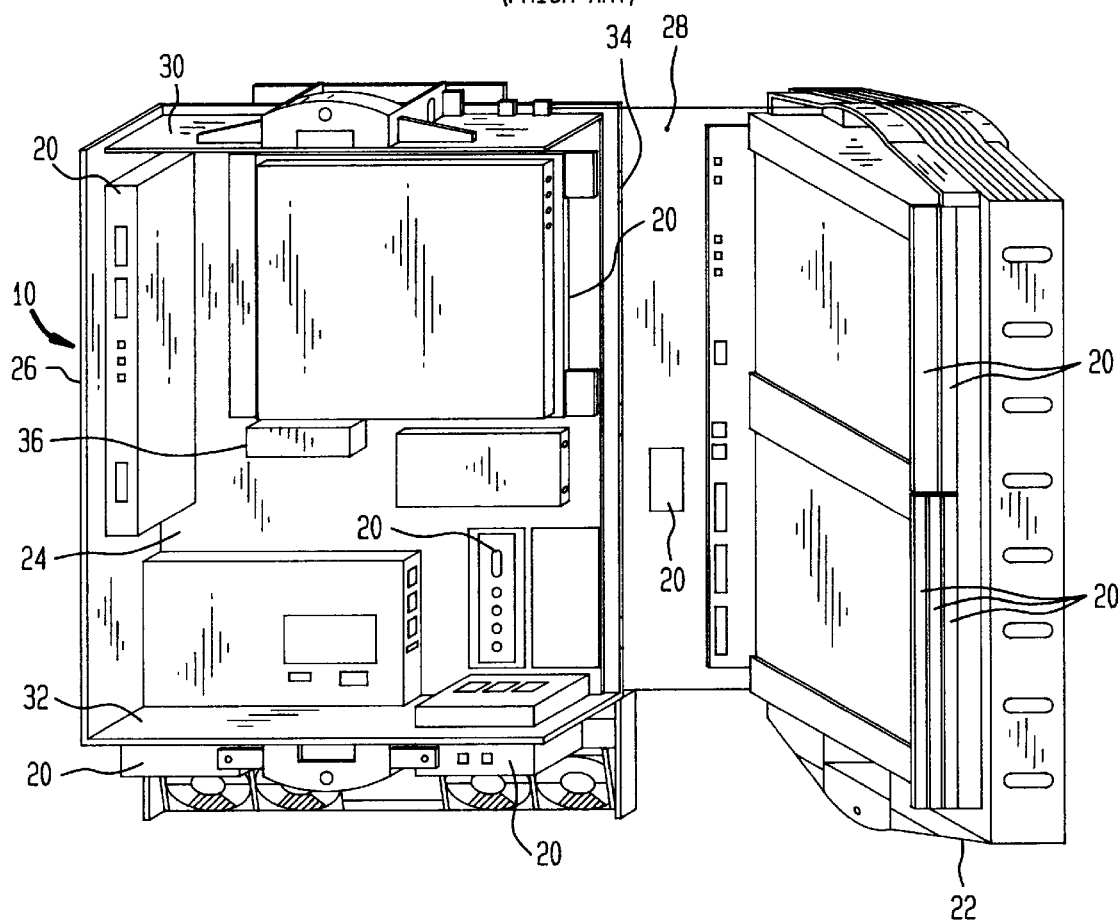
FIG. 2 is a perspective view showing the enclosure shown in FIG. 1 in an open position.

FIG. 2 illustrates the enclosure 10 in an open position. Thus, mounted to the interior of the enclosure 10 are a plurality of cellular telephone system base station electronic components 20, such as printed circuit boards, a duplex filter, an oscillator module, a power converting unit, a power amplifier, etc. The enclosure 10 comprises a front panel 22 (on which is mounted the exterior wall 14), a rear panel 24, a first side panel 26, a second side panel 28, a top panel 30, and a bottom panel 32. The second side panel 28 is fixedly secured to the front panel 22 and is connected to the rear panel 24 by hinges 34, which permit the enclosure 10 to be readily changed between its open and closed positions.

As previously discussed, the electronic components 20 should not be operated below a certain temperature. Accordingly, the prior art enclosure 10 is provided with a heater 36 mounted to the rear panel 24 to maintain a minimum temperature within the enclosure 10. While effective, the heater 36 occupies space that could otherwise be occupied by additional electronic components.

Figure 3:
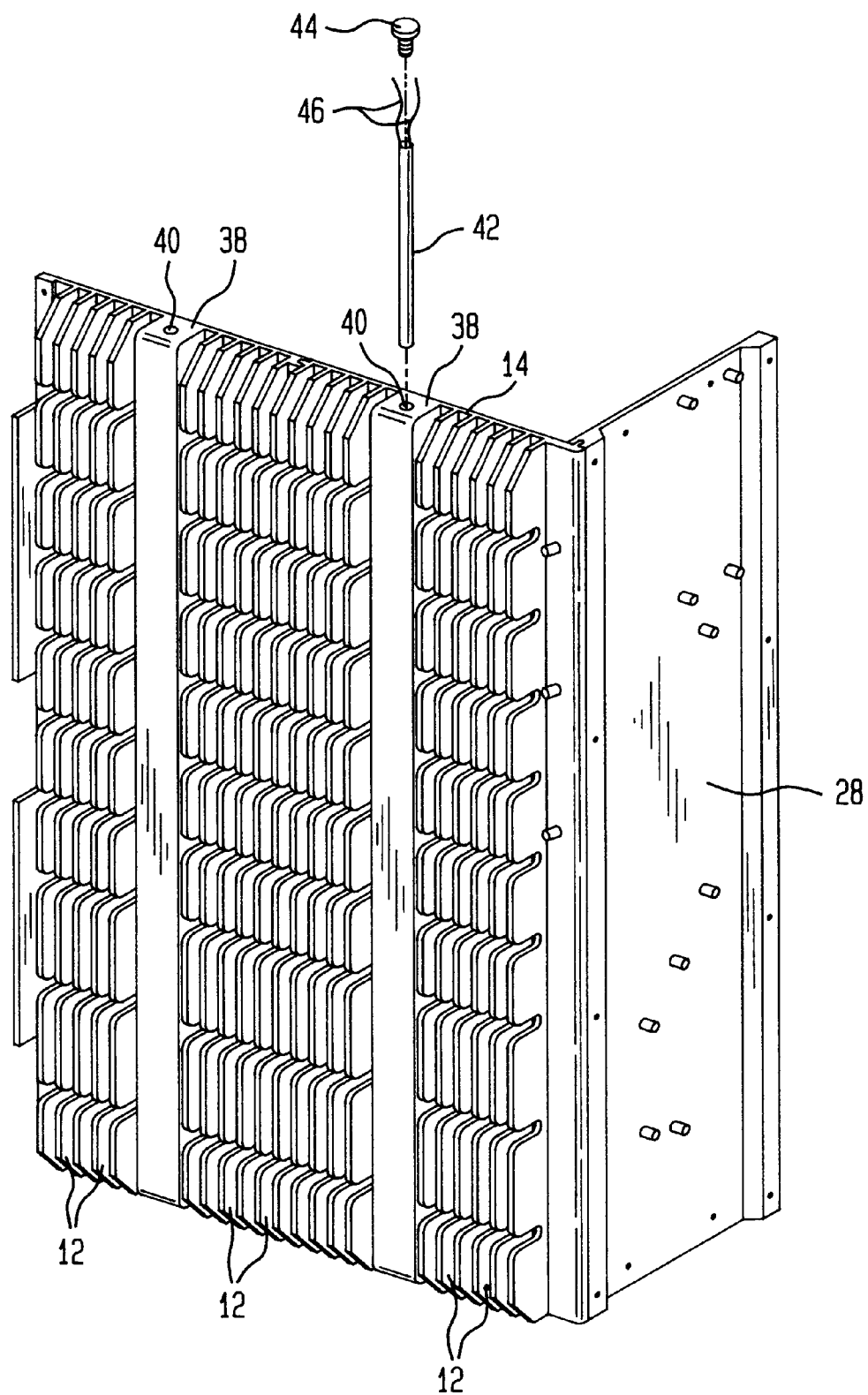
FIG. 3 is a perspective view showing an embodiment of the present invention applied to the enclosure shown in FIGS. 1 and 2.

According to the present invention, valuable space within the enclosure 10 is saved for electronic components by removing the heater 36 from inside the enclosure and replacing it with structure exterior to the enclosure 10 and on the exterior wall 14. Thus, as shown in FIG. 3, one or more bosses 38 can be cast or extruded horizontally or vertically between the fins 12 during extrusion of the wall 14. A cavity 40 is then drilled in each of the bosses 38. Illustratively, the bosses 38 extend vertically, taking up space otherwise occupied by one or more columns of the fins 12. The cavity 40 is a cylindrical bore having a longitudinal axis extending parallel to the fins 12. A cylindrical heater 42 is then inserted in the cavity 40. The heater 42 and the cavity 40 are sized so that the heater 42 fits closely within the cavity 40 in heat conducting contact therewith. A weather tight plug 44 seals the cavity 40 from the elements after insertion of the heater 42. The heater wires 46 can be routed into the enclosure 10 by means of a suitable opening (not shown) through the exterior wall 14 and into the cavity 40. To insure protection of the heater 42, it is preferred that the cavity 40 be open only at the bottom of the boss 38.

As an alternative to a single long cavity 40, since a long vertical bore may be difficult and expensive to create, the boss 38 may be formed with steps and bores may be drilled in selected ones of the steps. Also, shorter bosses may be formed at various locations where heaters are needed.

The aforedescribed construction possesses a number of advantages. Thus, for example, all internal surfaces of the enclosure 10 can be used for mounting electronic components. Also, the heaters can be placed exactly where they are needed for uniform heat dissipation, which also results in minimizing the electric power required to operate the heaters. Further, the heaters can be removed without disturbing any internal components.

Accordingly, there has been disclosed structure for providing heat for an electrical assembly in an enclosure. While an illustrative embodiment of the present invention has been disclosed herein, it is understood that various modifications and adaptations to the disclosed embodiment are possible, and it is intended that this invention be limited only by the scope of the appended claims.

What is claimed is:

1. An enclosure for electronic components including structure for providing heat for said components, said structure comprising:

a heat conductive outer wall for said enclosure; and a heating element mounted to the exterior of said outer wall;

wherein said outer wall includes an external boss having a cavity and said heating element is secured in said cavity in heat conducting contact therewith.

2. The structure according to claim 1 wherein said external boss is a unitary part of said outer wall.

3. The structure according to claim 1 further including a seal for said cavity.

4. The structure according to claim 1 wherein said outer wall is formed with a plurality of external parallel planar heat conducting fins and said external boss is formed between a pair of adjacent ones of said fins.

5. The structure according to claim 4 wherein said cavity is formed as a cylindrical bore having a longitudinal axis extending parallel to said fins and said heating element has a cylindrical shell sized to fit closely within said bore.

6. The structure according to claim 5 further including a plug for sealing said bore.

7. The structure according to claim 6 wherein the longitudinal axis of said bore extends generally vertically.

* * * * *